United States Patent
Lee

(10) Patent No.: US 6,621,757 B2
(45) Date of Patent: Sep. 16, 2003

(54) SEMICONDUCTOR MEMORY DEVICE HAVING ASYMMETRIC DATA PATHS

(75) Inventor: Jae-woong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/044,770

(22) Filed: Jan. 10, 2002

(65) Prior Publication Data

US 2002/0149990 A1 Oct. 17, 2002

(30) Foreign Application Priority Data

Apr. 13, 2001 (KR) .................................. 2001-0019946

(51) Int. Cl.[7] ................................................. G11C 8/00
(52) U.S. Cl. ............................ 365/230.03; 365/230.02; 365/230.06
(58) Field of Search ...................... 365/230.03, 230.02, 365/230.06, 189.01, 189.02, 189.04, 189.05

(56) References Cited

U.S. PATENT DOCUMENTS 5,864,505 A * 1/1999 Higuchi ................. 365/189.04
6,134,178 A * 10/2000 Yamazaki et al. ........... 365/233

* cited by examiner

Primary Examiner—David Lam
(74) Attorney, Agent, or Firm—Myers Bigel Sibley & Sajovec, P.A.

(57) ABSTRACT

A semiconductor memory device having an asynchronous data path is provided. The data path may compensate for differences between the path from a control circuit to memory banks and from memory banks to output pads of the semiconductor memory. The memory device may include first and second memory banks for storing data, output pads arranged adjacent to the second memory bank, and a control circuit arranged adjacent to the first memory bank for controlling operation of the first memory bank and the second memory bank in response to an external control signal. A first output circuit is adjacent the first memory bank for transmitting data from the first memory bank to the output pads in response to an output signal. A second output circuit is adjacent the second memory bank for transmitting data from the second memory bank to the output pads in response to the output signal.

21 Claims, 2 Drawing Sheets

SEMICONDUCTOR MEMORY DEVICE HAVING ASYMMETRIC DATA PATHS

RELATED APPLICATIONS

The present application claims priority from Korean Application Serial No. 2001-0019946 filed Apr. 13, 2001, the disclosure of which is incorporated herein by reference as if set forth fully herein.

FIELD OF THE INVENTION

The present invention relates to semiconductor devices, and more particularly, to data paths of semiconductor memory devices.

BACKGROUND OF THE INVENTION

A semiconductor memory device, especially a synchronous dynamic random access memory (SDRAM), is synchronized with a clock signal and stores data in a memory bank or outputs data in response to externally input address signals and command signals. In general, the SDRAM has more than two memory banks for storing data and is arranged symmetrically with control circuits for controlling operations of the memory banks. The externally input signals and data are transmitted to the memory banks through input pads and the control circuits, and data output from the memory banks are output to the SDRAM through the control circuits and output pads.

The address signals and command signals are externally applied to the memory banks through the input pads and the control circuits so that the data stored in the memory banks may be read. Then the data stored in the memory banks are output through the control circuits and the output pads.

Likewise, as the control circuits are arranged in the center of the memory banks, circuit arrangement and/or simulation may be simplified. However, when the data stored in the memory banks are read, the data stored in the memory banks, typically, must pass through the control circuits arranged in the center of the memory banks and be output through the output pads. Thus, data read times may be delayed. While conventional techniques may provide for increasing the capacity of the semiconductor memory device and/or operational speed may be improved, delay of the data read time may hinder high speed operation of the semiconductor memory device.

SUMMARY OF THE INVENTION

Embodiments of the present invention provide semiconductor memory devices having first and second memory banks for storing data, output pads arranged adjacent to the second memory bank and a control circuit arranged adjacent to the first memory bank for controlling operation of the first memory bank in response to an external control signal. A first output circuit is arranged adjacent to the first memory bank for transmitting data output from the first memory bank to the output pads in response to an output signal of the control circuit. A second output circuit is arranged adjacent to the second memory bank for transmitting data output from the second memory bank to the output pads in response to the output signal of the control circuit.

In further embodiments of the present invention, input pads are arranged adjacent to the first memory bank for transmitting the external control signal to the control circuit. The external control signal may include an address signal and a command signal. Furthermore, the control circuit may include a column address generator for generating a column address signal to select columns of the first and second memory banks. Row decoders for decoding a row address output from the control circuit and column decoders for decoding a column address output from the control circuit may also be arranged adjacent to the first and second memory banks.

In additional embodiments of the present invention, the first and second output circuits include an input/output sense amplifying unit for sensing and amplifying input and output data. The first and second output circuits may also include a multiplexing unit for controlling data output from the first and second memory bank, respectively, to be transmitted to the output pads in response to the output signal of the control circuit.

In particular embodiments of the present invention, the time taken for the control signal to access a plurality of memory cells included in the first memory bank is faster than the time taken for the control signal to access a plurality of memory cells included in the second memory bank. Furthermore, the time taken for the data output from the second memory bank to reach the output pads may be faster than the time taken for the data output from the first memory bank to reach the output pads. The path taken by the output signal of the control circuit to access the plurality of memory cells included in the first memory bank added to the path taken by the data output from the first memory bank and transmitted to the output pads may have the same or similar length to the path taken by the output signal to access the plurality of memory cells included in the second memory bank added to the path taken by the data output from the second memory bank and transmitted to the output pads.

In further embodiments of the present invention, the semiconductor memory device is a synchronous dynamic random access memory (SDRAM) operating in synchronization with a clock signal.

In still further embodiments of the present invention, read access to a first and a second memory bank of a semiconductor memory device having a control circuit for providing control signals to the first and second memory banks and output pads for output data from the first and second memory banks is provided by arranging the control circuit and the output pads with respect to the first and second memory banks such that a first difference between a time taken to provide control signals to the first memory bank and a time taken to provide control signals to the second memory bank is compensated for by a second difference between a time taken to provide data to the output pads from the second memory bank and a time taken to provide data to the output pads from the first memory bank.

Such an arrangement may be provided by locating the control circuit adjacent the first memory bank a first distance that is less than a distance from the control circuit to the second memory bank and locating the output pads adjacent the second memory bank a second distance that is less than a distance from the output pads to the first memory bank. Furthermore, the first distance and the second distance may be substantially the same. The first distance and the second distance may be selected such that the first difference and the second difference are substantially the same.

In still further embodiments of the present invention, a semiconductor memory device includes a first memory bank and a second memory bank. A control circuit is provided adjacent the first memory bank which controls read operations for both the first and the second memory banks. Output pads are provided adjacent the second memory bank for outputting data from the first and the second memory banks. The location of the control circuit and the location of the output pads provides substantially the same transmission delay for control signals from the control circuit to the second memory bank as for data output signals from the first memory bank to the output pads.

BRIEF DESCRIPTION OF THE DRAWINGS

The objects and advantages of the present invention will become more apparent by describing in detail preferred embodiments thereof with reference to the attached drawings in which.

DETAILED DESCRIPTION OF THE INVENTION

Figure 1:
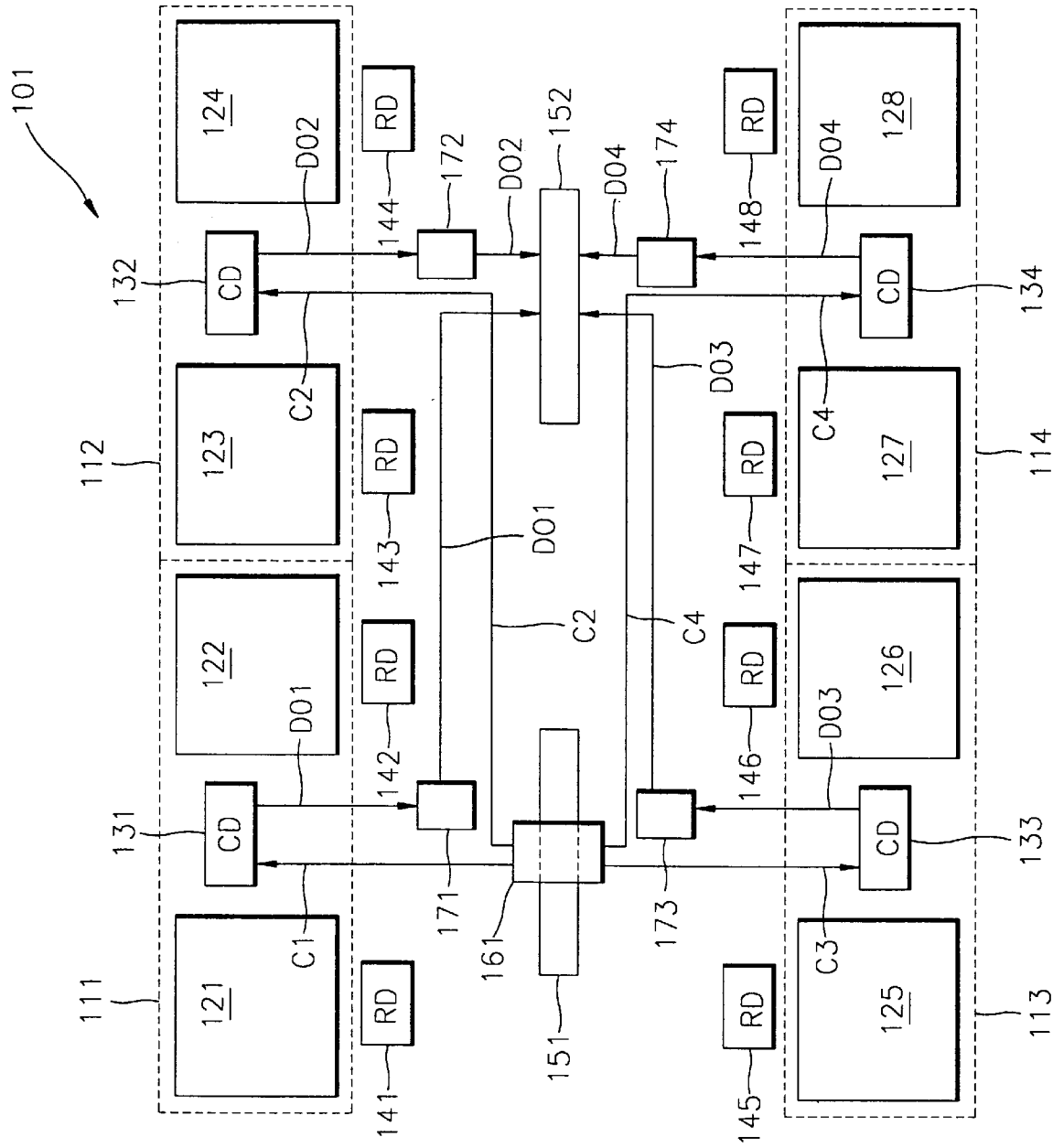
FIG. 1 is a layout diagram of an internal circuit of a semiconductor memory device according to a first embodiment of the present invention.

The present invention will be described more fully hereinafter with reference to the accompanying drawings in which preferred embodiments of the invention are shown. Like reference numerals refer to like elements throughout the drawings.

FIG. 1 is a layout diagram of an internal circuit of a semiconductor memory device according to a first embodiment of the present invention. Referring to FIG. 1, a semiconductor memory device 101 includes first through fourth memory banks 111–114, column decoders 131–134, row decoders 141–148, an input pad group 151, an output pad group 152, a control circuit 161, and first through fourth output circuits 171–174.

The first through fourth memory banks 111–114 store external data and include a plurality of memory cell arrays 121–128. The memory cell arrays 121–128 include a plurality of memory cells (not shown). The first through fourth memory banks 111–114 output data, which is being stored, in response to output signals C1–C4 of the control circuit 161.

The input pad group 151 consists of a plurality of input pads, and the output pad group 152 consists of a plurality of output pads. External signals are input into the semiconductor memory device 101 through the plurality of input pads of the input pad group 151, and data DO1, DO2, DO3 and DO4 stored in the first, second third and fourth memory banks 111, 112, 113 and 114, respectively, are output to the semiconductor memory device 101 through the plurality of output pads of the output pad group 152.

The control circuit 161 is arranged adjacent to the first and third memory banks 111 and 113. The control circuit 161 receives control signals, such as an address signal and a command signal, and transmits the control signals to the first through fourth memory banks 111–114. The first through fourth memory banks 111–114 operate in response to the output signals C1–C4 output from the control circuit 161. The control circuit 161 includes a column address generator (not shown) for generating a column address signal to select columns of the first through fourth memory banks 111–114. In embodiments where the semiconductor memory device 101 is a synchronous DRAM (SDRAM), the control signal and the output signals C1–C4 of the control circuit operate in synchronization with a clock signal.

The column decoders 131–134 are arranged adjacent to the first through fourth memory banks 111–114, respectively.

The column decoders 131–134 decode column address signals output from the control circuit 161, and transmit the decoded column address signals to corresponding memory banks. In the column decoders 131–134, columns of the corresponding memory banks are selected by the decoded column address signals.

The row decoders 141–148 are arranged adjacent to the first through fourth memory banks 111–114. The row decoders 141–148 decode row address signals output from the control circuit 161 and transmit the decoded row address signals to corresponding memory banks. In the row decoders 141–148, rows of the corresponding memory banks are selected by the decoded row address signals.

The first and third output circuits 171 and 173 are arranged adjacent to the first and third memory banks 111 and 113. The first and third output circuits 171 and 173 transmit the data DO1 and DO3, respectively, output from the first and third memory banks 111 and 113 to the output pads of the output pad group 152 in response to the output signals C1 and C3 of the control circuit 161.

The second and fourth output circuits 172 and 174 are arranged adjacent to the second and fourth memory banks 112 and 114. The second output circuit 172 transmits the data DO2 output from the second memory bank 112 to the output pads of the output pad group 152 in response to the output signal C2 of the control circuit 161. The fourth output circuit 174 transmits the data DO4 output from the fourth memory bank 114 to the output pads of the output pad group 152 in response to the output signal C4 of the control circuit 161.

The first through fourth output circuits 171–174 include an input/output sense amplifying unit (not shown) for sensing and amplifying input and output data, and a multiplexing unit (not shown) for controlling the data DO1–DO4 output from the respective first through fourth memory banks 111–114 to be transmitted to the output pads in response to the respective output signals C1–C4 of the control circuit 161.

In this way, the control circuit 161 is arranged adjacent to the first and third memory banks 111 and 113. As a result, the time taken for the control signals C1 and C3 to access the plurality of memory cells included in the first and third memory bank 111 and 113 is faster than the time taken for the control signals C2 and C4 to access the plurality of memory cells included in the second and fourth memory banks 112 and 114. The first and third output circuits 171 and 173 are arranged adjacent to the first and third memory banks 111 and 113, and the second and fourth output circuits 172 and 174 are arranged adjacent to the second and fourth memory banks 112 and 114 while the output pad group 152 is arranged adjacent the second and fourth memory banks 112 and 114. As a result, the time taken for the data DO2 and DO4 output from the second and fourth memory banks 112 and 114 to reach the corresponding output pads of the output pad group 152 is faster than the time taken for the data DO1 and DO3 output from the first and third memory banks 111 and 113 to reach the corresponding output pads of the output pad group 152.

The path taken by the output signals C1 and C3 of the control circuit 161 to access the plurality of memory cells included in the first and third memory banks 111 and 113 added to the path taken by the data DO1 and DO3 output from the first and third memory banks 111 and 113 and transmitted to the output pads of the output pad group 152 has the same or similar length to the path taken by the output signals C2 and C4 to access the plurality of memory cells included in the second and fourth memory banks 112 and 114 added to the path taken by the data DO2 and DO4 output from the second and fourth memory banks 112 and 114 and transmitted to the output pads of the output pad group 152. Thus, the time difference between the data DO1 and DO3 output from the first and third memory banks 111 and 113 and the data DO2 and DO4 output from the second and fourth memory banks 112 and 114 being available at the corresponding output pads of the output pad group 152 may be reduced, minimized or even eliminated.

As described above, the first and third output circuits 171 and 173 are arranged adjacent to the first and third memory banks 111 and 113, and the second and fourth output circuits 172 and 174 are arranged adjacent to the second and fourth memory banks 112 and 114. As a result, the time taken for the data DO2 and DO4 to pass through the second and fourth output circuits 172 and 174 and reach the corresponding output pads of the output pad group 152 may be reduced. Thus, the data read time of the semiconductor memory device 101 may be reduced and the operation speed of the semiconductor memory device 101 may be increased by the same amount of time as the data read time is reduced.

Figure 2:
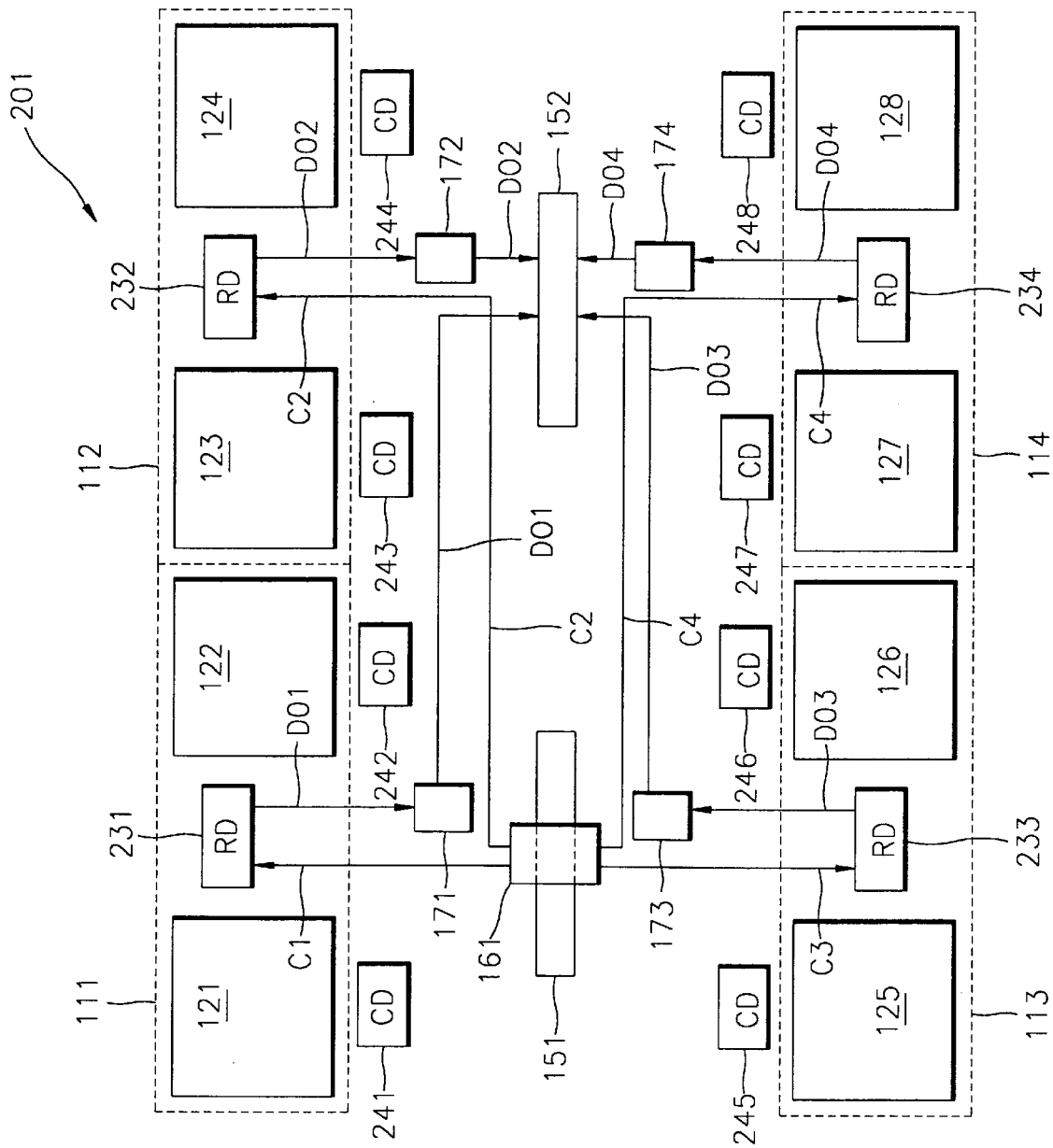
FIG. 2 is a layout diagram of an internal circuit of a semiconductor memory device according to a second embodiment of the present invention.

FIG. 2 is a layout diagram of an internal circuit of a semiconductor memory device according to a second embodiment of the present invention. Referring to FIG. 2, a semiconductor memory device 201 includes first through fourth memory banks 111–114, column decoders 241–248, row decoders 231–234, an input pad group 151, an output pad group 152, a control circuit 161, and first through fourth output circuits 171–174. The structure of the semiconductor memory device 201 of FIG. 2 is similar to that of the semiconductor memory device 101 of FIG. 1, and only the position of the column decoders 241–248, and the row decoders 231–234 are varied, so redundant descriptions thereof will be omitted.

In the semiconductor memory devices 101 and 201 of FIGS. 1 and 2, the path taken for the control signal to access the first and third memory banks 111 and 113 is different in length from the path taken for the control signal to access the second and fourth memory banks 112 and 114 and, thus, the first through fourth memory banks 111–114 have asynchronous data paths.

While embodiments of the present invention have been illustrated above with reference to four memory banks, as will be appreciated by those of skill in the art the benefits of the present invention may be achieved with semiconductor devices having two or more memory banks. Thus, the control circuit and output circuits of the semiconductor devices may be laid out such that differences in control paths of two different memory banks are compensated for by differences in data output paths of the two memory banks such that read operations of the two memory devices provide data to output pads of the semiconductor device at substantially the same time.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
   first and second memory banks configured to store data;
   output pads adjacent to the second memory bank;
   a control circuit adjacent to the first memory bank that controls operation of the first memory bank and the second memory bank in response to an external control signal;
   a first output circuit adjacent to the first memory bank that transmits data output from the first memory bank to the output pads in response to an output signal of the control circuit; and
   a second output circuit adjacent to the second memory bank that transmits data output from the second memory bank to the output pads in response to the output signal of the control circuit;
   wherein a path length from the first output circuit to the output pads is greater than a path length from the second output circuit to the output pads.

2. The semiconductor memory device of claim 1, wherein the first and second output circuits further comprise an input/output sense amplifying unit that senses and amplifies input and/or output data.

3. The semiconductor memory device of claim 1, wherein the semiconductor memory device is a synchronous dynamic random access memory (SDRAM) operating in synchronization with a clock signal.

4. A semiconductor memory device comprising:
   first and second memory banks configured to store data;
   output pads adjacent to the second memory bank;
   a control circuit adjacent to the first memory bank that controls operation of the first memory bank and the second memory bank in response to an external control signal;
   a first output circuit adjacent to the first memory bank that transmits data output from the first memory bank to the output pads in response to an output signal of the control circuit;
   a second output circuit adjacent to the second memory bank that transmits data output from the second memory bank to the output pads in response to the output signal of the control circuit; and
   input pads adjacent to the first memory bank that transmit the external control signal to the control circuit.

5. A semiconductor memory device comprising:
   first and second memory banks configured to store data;
   output pads adjacent to the second memory bank;
   a control circuit adjacent to the first memory bank that controls operation of the first memory bank and the second memory bank in response to an external control signal,
   a first output circuit adjacent to the first memory bank that transmits data output from the first memory bank to the output pads in response to an output signal of the control circuit;
   a second output circuit adjacent to the second memory bank that transmits data output from the second memory bank to the output pads in response to the output signal of the control circuit; and
   wherein the external control signal includes an address signal and a command signal.

6. A semiconductor memory device comprising:
   first and second memory banks configured to store data;
   output pads adjacent to the second memory bank;
   a control circuit adjacent to the first memory bank that controls operation of the first memory bank and the second memory bank in response to an external control signal;
   a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit; and wherein the control circuit includes a column address generator that generates a column address signal to select columns of the first and second memory banks.

7. A semiconductor memory device comprising:

first and second memory banks configured to store data;

output pads adjacent to the second memory bank;

a control circuit adjacent to the first memory bank that controls operation of the first memory bank and the second memory bank in response to an external control signal;

a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit;

row decoders adjacent the first and second memory banks that decode a row address output from the control circuit; and column decoders adjacent the first and second memory banks that decode a column address output from the control circuit.

8. A semiconductor memory device comprising:

first and second memory banks configured to store data;

output pads adjacent to the second memory bank;

a control circuit adjacent to the first memory bank that controls operation of the first memory bank and the second memory bank in response to an external control signal;

a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit; and wherein the first and second output circuits further comprise a multiplexing unit that controls data output from the first and second memory bank, respectively, to be transmitted to the output pads in response to the output signal of the control circuit.

9. A semiconductor memory device comprising:

first and second memory banks configured to store data;

output pads adjacent to the second memory bank;

a control circuit adjacent to the first memory bank that controls operation of the first memory bank and the second memory bank in response to an external control signal;

a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit; and wherein the control circuit is arranged such that a time for the control signal to access a plurality of memory cells included in the first memory bank is faster than the time taken for the control signal to access a plurality of memory cells included in the second memory bank.

10. A semiconductor memory device comprising:

first and second memory banks configured to store data;

output pads adjacent to the second memory bank;

a control circuit adjacent to the first memory bank that controls operation of the first memory bank and the second memory bank in response to an external control signal;

a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit; and wherein a time the data output from the second memory bank takes to reach the output pads is faster than a time for the data output from the first memory bank to reach the output pads.

11. A semiconductor memory device comprising:

first and second memory banks configured to store data;

output pads adjacent to the second memory bank;

a control circuit adjacent to the first memory bank that controls operation of the first memory bank and the second memory bank in response to an external control signal;

a first output circuit adjacent to the first memory bank that transmits data output from the first memory bank to the output pads in response to an output signal of the control circuit;

a second output circuit adjacent to the second memory bank that transmits data output from the second memory bank to the output pads in response to the output signal of the control circuit; and wherein a path taken by the output signal of the control circuit to the plurality of memory cells included in the first memory bank added to a path taken by the data output from the first memory bank to the output pads has substantially the same length a path taken by the output signal of the control circuit to the plurality of memory cells included in the second memory bank added to a path taken by the data output from the second memory bank to the output pads.

12. A method of providing read access to a first and a second memory bank of a semiconductor memory device having a control circuit for providing control signals to the first and second memory banks and output pads for output data from the first and second memory banks, comprising:

arranging the control circuit and the output pads with respect to the first and second memory banks such that a first difference between a time taken to provide control signals to the first memory bank and a time taken to provide control signals to the second memory bank is compensated for by a second difference between a time taken to provide data to the output pads from the second memory bank and a time taken to provide data to the output pads from the first memory bank.

13. The method of claim 12, wherein the step of arranging comprises the steps of:

locating the control circuit adjacent the first memory bank a first distance that is less than a distance from the control circuit to the second memory bank; and locating the output pads adjacent the second memory bank a second distance that is less than a distance from the output pads to the first memory bank.

14. The method of claim 13, wherein the first distance and the second distance are substantially the same.

15. The method of claim 13, wherein the first distance and the second distance are selected such that the first difference and the second difference are substantially the same.

16. A semiconductor memory device, comprising:
   a first memory bank;
   a second memory bank;
   a control circuit adjacent the first memory bank which controls read operations for both the first and the second memory banks;
   output pads adjacent the second memory bank for outputting data from the first and the second memory banks; and
   wherein the location of the control circuit and the location of the output pads provides substantially the same transmission delay for control signals from the control circuit to the second memory bank as for data output signals from the first memory bank to the output pads.

17. The semiconductor memory device of claim 16, further comprising input pads adjacent to the first memory bank for transmitting external control signals to the control circuit.

18. The semiconductor memory device of claim 17, wherein the external control signals include an address signal and a command signal.

19. The semiconductor memory device of claim 16, wherein the control circuit includes a column address generator configured to generate a column address signal to select columns of the first and second memory banks.

20. The semiconductor memory device of claim 16, wherein row decoders configured to decode a row address output from the control circuit and column decoders configured to decode a column address output from the control circuit a re arranged adjacent to the first and second memory banks.

21. The semiconductor memory device of claim 16, wherein the semiconductor memory device is a synchronous dynamic random access memory (SDRAM) operating in synchronization with a clock signal.

* * * * *